United States Patent [19]
Greutman

[11] 3,803,503
[45] Apr. 9, 1974

[54] NEUTRALIZED DRIVER AMPLIFIER CIRCUIT

[75] Inventor: Weldon W. Greutman, Hicksville, Ohio

[73] Assignee: International Telephone and Telegraph Corporation, Nutley, N.J.

[22] Filed: May 11, 1973

[21] Appl. No.: 359,580

[52] U.S. Cl. ........................ 330/13, 330/15, 330/17, 330/26, 330/32, 330/156
[51] Int. Cl. ........................ H03f 3/18
[58] Field of Search ............. 330/13, 17, 15, 26, 27, 330/32, 156

[56] References Cited

UNITED STATES PATENTS 3,663,887 5/1972 Dix ..................................... 330/13

*Primary Examiner*—Herman Karl Saalbach
*Assistant Examiner*—James B. Mullins
*Attorney, Agent, or Firm*—John T. O'Halloran; Menotti J. Lombardi, Jr.; Edward Goldberg

[57] ABSTRACT

The collector to base capacitances of the input stage of two pairs of series connected direct coupled complementary emitter follower amplifiers are neutralized by feedback of signal from the output emitters to the input stage collectors. The circuit provides improved coupling between a high impedance source and a low impedance load and has a rapid response to bipolar signal variations over a wide frequency range with low quiescent power requirements.

4 Claims, 1 Drawing Figure

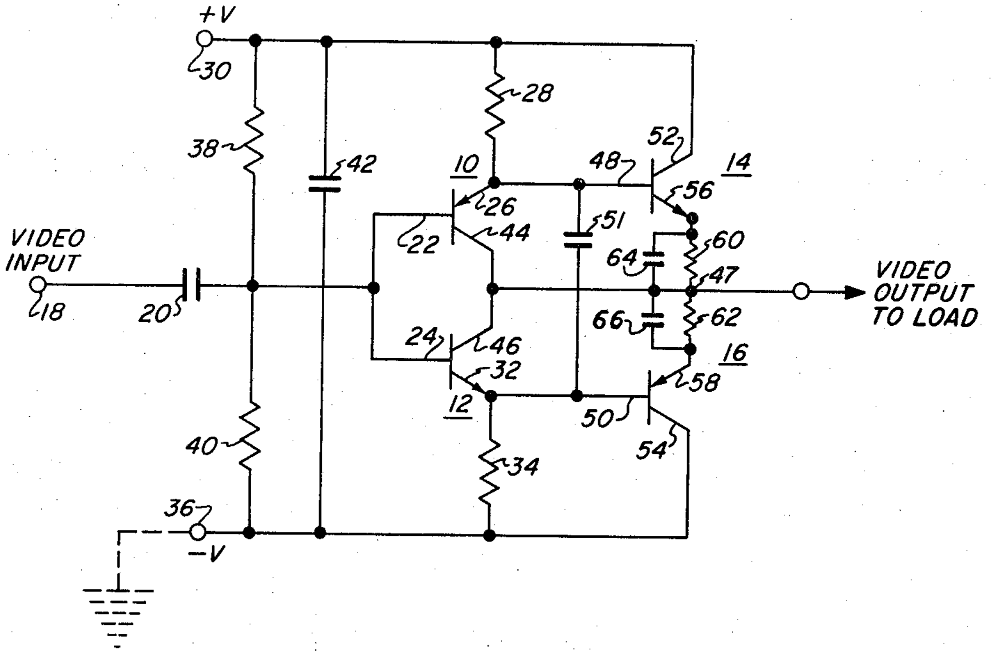
+V
30
38
42
28
10
26
22
44
48
52
14
56
51
60
64
47
VIDEO INPUT
18
20
VIDEO OUTPUT TO LOAD
66
62
24
46
32
16
58
12
50
54
40
34
36
-V

NEUTRALIZED DRIVER AMPLIFIER CIRCUIT

BACKGROUND OF THE INVENTION

1. Field of the Invention

The present invention concerns a circuit for coupling between a high impedance signal source and a low impedance load and particularly to a novel driver circuit for neutralizing collector to base capacitance of an input stage of a wide band emitter follower amplifier.

2. Description of the Prior Art

Previously known circuits for providing isolation between a high impedance source and low impedance load have utilized pairs of complementary emitter follower transistor amplifiers such as shown in U.S. Pat. No. 3,281,703, issued Oct. 25, 1966 and U.S. Pat. No. 3,418,589, issued Dec. 24, 1968. Such circuits, however, had relatively limited operating frequency ranges with high quiescent power requirements and unequal rates of response to signal input changes of different polarities. A major problem in this respect is the high input capacitance due to the inherent collector to base capacitance of the input transistors which present a non-symmetrical impedance and charge characteristics for different polarity signals. The use of a Darlington connected pair of complementary transistors for the purpose of eliminating base-emitter junction offset voltages in a wide band amplifier is also known, as described in copending U.S. Pat. application Ser. No. 359,386, filed May 11, 1973, in the name of the present inventor and assigned to the same assignee as the instant application. These prior art circuits however were not able to achieve the desired neutralization of collector-base input capacitances to provide coupling between a high impedance signal source and low impedance load over a wide band with rapid bipolar response and low quiescent power.

SUMMARY OF THE INVENTION

It is therefore the primary object of the present invention to provide an improved impedance matching wide band amplifier of substantially unity gain which neutralizes the collector-base capacitance of the input transistors to achieve rapid bipolar response to signal variations while using minimum quiescent power.

These results are obtained by a novel circuit having a first pair of series connected complementary emitter follower input transistors directly coupled in a Darlington connection to a second pair of oppositely arranged complementary emitter follower output transistors. A direct coupled feedback connection from a common point between the output emitters to the input stage collectors provides a bootstrap effect which substantially neutralizes the input collector-base capacitances. The complementary Darlington connected pairs also negate the base-emitter offset voltages with the use of relatively low quiescent current, while neutralization permits rapid response to bipolar signal variations over a wide band of frequencies. The details of the invention will be more fully understood from the following description in conjunction with the accompanying drawing.

BRIEF DESCRIPTION OF THE DRAWING

The single FIGURE shows a schematic drawing of the novel driver amplifier circuit.

DESCRIPTION OF THE PREFERRED EMBODIMENT

As shown in the FIGURE, a first pair of complementary series connected emitter follower transistors 10, 12 provide the input stage of the novel driver circuit. Transistors 10, 12 are directly coupled in a Darlington connection to respective transistors 14, 16 of a second pair of oppositely arranged series connected complementary emitter followers which provide the output stage. Input signal, such as supplied by a final video amplifier stage of a display device, is fed to input terminal 18 and through a coupling capacitor 20 to the two input base electrodes 22, 24 of transistors 10, 12. Capacitor 20 may be eliminated to provide a direct coupling arrangement. Transistor 10 is of an PNP type with emitter output electrode 26 connected through a resistor 28 to the positive polarity terminal 30 of a suitable source of direct voltage, while transistor 12 is of a complementary NPN type with emitter 32 connected through a like valued resistor 34 to the opposite polarity terminal 36 of the direct voltage source. The input stage emitters are also coupled to the output stage, as will be described further. A pair of suitable voltage divider resistors 38, 40 are connected between the direct voltage source terminals, with the center of the divider connected to the bases 22, 24 to establish the desired low current quiescent operating point of transistors 10, 12. The actual reference bias will depend upon the required polarity of the output signal to be supplied to the load circuit. A suitable capacitor 42 is connected across the voltage source terminals to provide signal decoupling to the power supply. The input stage collector electrodes 44, 46 are connected together and to a common center point 47 of the output circuit. The input emitter follower stage provides a relatively high input impedance and low output impedance for coupling to a high impedance input signal source and provides a signal amplification of about 0.95 between input and output electrodes, or substantially unity gain.

Emitters 26, 32 are directly coupled in a Darlington connection to respective base input electrodes 48, 50 of a second pair of oppositely arranged conductivity type series connected complementary emitter follower output stage transistors 14, 16. A relatively large capacitor 51 connected between bases 48, 50 assures application of equal input signal amplitudes to both output stages for proper bipolar operation. The particular complementary Darlington configuration of the input and output stages negates the base-emitter offset voltages of each of the direct coupled transistors and permits use of low quiescent currents. The collector electrode 52 of the NPN output stage transistor 14 is connected to the positive terminal of the direct voltage source, while collector 54 of the PNP transistor 16 is connected to the negative terminal. The output emitter electrodes 56, 58 are connected together through suitable small series emitter resistors 60, 62 to the common output terminal point 47 which feeds an output load circuit. The emitter resistors establish the desired quiescent operating current through output stage transistors 14, 16. Suitable high frequency bypass capacitors 64, 66 are connected in parallel with the respective emitter resistors 60, 62 to provide proper coupling to drive a capacitive load circuit such as the grid electrode of a cathode ray tube display device. The emitter follower output stage again provides an amplification of about 0.95 or a substantially unity gain between input and output.

The Darlington connection permits direct coupling from the common output terminal 47 between output emitters 56, 58 to the input stage collector electrodes 44, 46 to provide a feedback signal from the low impedance output to the input stage. This operates in the manner of a bootstrap circuit so that the signal at base input electrodes 22, 24 is substantially equal in phase and amplitude to that of the collector electrodes 44, 46, with both electrodes of each input transistor rising and falling together with signal changes. The effect of this action is to substantially neutralize the normal collector to base capacitance inherent in the input stage transistors and to present an apparent low input capacitance to the high impedance source. The input signal source effectively feeds only a relatively small net input capacitance which is much less than the actual capacitance. This eliminates the usual nonsymmetrical impedance to signals of opposite polarities which results from differences between capacitance charge and discharge timing characteristics. Thus, a fast response, or high slew capability, is provided for both positive and negative input signal amplitude transitions with relatively low quiescent power. The normal connection of the collector electrodes to the direct voltage source, as in the prior art circuits, places the collectors at signal ground which results in the collector to base capacitance being charged by the input source generator action. The present unique feedback coupling to the common input stage collector connection and the connection of the input stage emitters to the voltage supply terminals with direct signal coupling to the output stages provides this unusual effect which neutralizes collector-base input capacitance and permits wide band bipolar operation from near d.c. or zero frequency up to over 30 MHz.

In the illustrated embodiment, the upper and lower halves of the circuit conduct alternately with output from the upper PNP input stage transistor 10 occurring with a negative going input signal while NPN transistor 12 will provide output with a positive going input signal. These same polarity signals from alternately conducting emitters 26, 32 are directly coupled to the associated base electrodes of the second stage output transistors which alternately supply output signal from emitters 56, 58 connected to the center output terminal 47 with respect to a signal reference point. As shown, the upper direct voltage terminal 30 is positive, while the lower terminal is negative or may be grounded. The actual polarities and voltages are not critical, but particular potential relationships are required within the limits of the transistor design ratings. A relatively large potential source of +85 volts d.c., for example, permits the circuit to handle large output signals of up to 80 volts in this instance. Quiescent currents are in the order of 4 ma. in the input stage and 2 ma. in the output stage, with an apparent input capacitance of 0.5 pfd. The same circuit operation may also be provided with an arrangement in which polarities of the various elements including the potential source and conductivity type transistors are reversed. The particular values of the various elements are likewise not critical. One embodiment of the circuit includes the following components:

Transistor 10, — 2N2907A
Transistor 12, — 2N2222A
Transistor 14, — 2N3500
Transistor 16, — 2N3495
Capacitors 20, 42, 51, — 0.1 mfd. each
Resistors 28, 34, 38, 40, — 10K ohms each
Resistors 60, 62, — 22 ohms each
Capacitors 64, 66, — 0.01 mfd. each.

The present invention thus provides an improved neutralized isolation amplifier and driver circuit having high signal handling capability with rapid response to bipolar signals over a wide frequency range and relatively low power requirements. While only a single embodiment has been illustrated and described it is to be understood that many variations may be made in the design and configuration without departing from the scope of the invention as set forth in the appended claims.

What is claimed is:

1. An amplifier circuit comprising:

an input stage including a pair of first and second complementary series connected emitter follower transistors, each input transistor having base, emitter and collector eletrodes;

an output stage including a pair of third and fourth oppositely arranged complementary series connected emitter follower transistors, each output transistor having base, emitter and collector electrodes;

means applying input signal to the base electrodes of said input pair of transistors;

direct voltage supply means having opposite polarity terminals and including bias means connected to said input base electrodes, the emitters of said input transistors being directly coupled to respective bases of said output transistors and connected to respective said opposite polarity terminals, the collectors of said input transistors being connected together, the emitters of said output transistors being connected together to a common output terminal supplying output signal to a load, the collectors of said output transistors being connected to respective said opposite polarity terminals; and means for feeding back said output signal from said output emitters common terminal to said collectors of said input transistors, said output signal being of substantially equal amplitude and polarity to that of said input signal.

2. The amplifier circuit of claim 1 wherein said bias means includes a pair of voltage divider resistors connected between said opposite polarity terminals of said supply means and having a central connection to said input base electrodes, a second pair of resistors respectively connected between each said input stage emitter electrode and said opposite polarity terminals, and a third pair of resistors respectively connected between each said output emitter and said common terminal.

3. The amplifier circuit of claim 2 including a first capacitor connected between said opposite polarity terminals, a second capacitor connected between said bases of said output transistors, and third and fourth capacitors respectively connected between each said output emitter and said common terminal.

4. The amplifier circuit of claim 3 wherein said first transistor is of a PNP type having an emitter electrode connected through one of said second pair of resistors to the positive polarity terminal of said direct voltage supply means, said second transistor is of a NPN type having an emitter electrode connected through the other resistor of said second pair to the negative polarity terminal, said third transistor is of a NPN type having a collector electrode connected to said positive polarity terminal, and said fourth transistor is of a PNP type having a collector electrode connected to said negative polarity terminal.

* * * * *